US009852255B2

(12) United States Patent
Brunham et al.

(10) Patent No.: US 9,852,255 B2
(45) Date of Patent: Dec. 26, 2017

(54) METHOD AND APPARATUS FOR IMPLEMENTING PERIPHERY DEVICES ON A PROGRAMMABLE CIRCUIT USING PARTIAL RECONFIGURATION

(71) Applicant: Altera Corporation, San Jose, CA (US)

(72) Inventors: Kalen B. Brunham, Toronto (CA); Gordon Raymond Chiu, North York (CA); Joshua David Fender, East York (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/171,560

(22) Filed: Jun. 2, 2016

(65) Prior Publication Data

US 2016/0283636 A1    Sep. 29, 2016

Related U.S. Application Data

(60) Continuation of application No. 13/902,813, filed on May 25, 2013, now Pat. No. 9,384,312, which is a division of application No. 13/368,437, filed on Feb. 8, 2012, now Pat. No. 8,476,926.

(51) Int. Cl.
*G06F 17/50*    (2006.01)
*H03K 19/177*    (2006.01)

(52) U.S. Cl.
CPC ........ *G06F 17/5072* (2013.01); *G06F 17/505* (2013.01); *G06F 17/5054* (2013.01); *G06F 17/5077* (2013.01); *H03K 19/1776* (2013.01); *H03K 19/17756* (2013.01)

(58) Field of Classification Search
CPC ................... G06F 17/5054; G06F 15/7867
USPC ........................................... 716/121
See application file for complete search history.

(56) References Cited

U.S. PATENT DOCUMENTS

| 6,326,806 | B1  | 12/2001 | Fallside et al. |
| 6,438,737 | B1* | 8/2002  | Morelli et al. ................. 326/38 |
| 6,480,954 | B2  | 11/2002 | Trimberger et al. |
| 6,525,562 | B1  | 2/2003  | Schultz et al. |
| 6,725,441 | B1* | 4/2004  | Keller et al. ................. 716/117 |
| 7,308,608 | B1* | 12/2007 | Pleis et al. ..................... 714/30 |
| 7,490,311 | B1  | 2/2009  | Payette |

(Continued)

FOREIGN PATENT DOCUMENTS

| CN | 101436225 A | 5/2009 |
| WO | WO 2009039566 | 4/2009 |

OTHER PUBLICATIONS

U.S. Appl. No. 13/902,813, filed May 25, 2013, In Re Application Kalen B. Brunham, et al.

(Continued)

*Primary Examiner* — Suchin Parihar
(74) *Attorney, Agent, or Firm* — L. Cho

(57) ABSTRACT

A programmable circuit includes a physical interface at an input output (IO) periphery of the programmable circuit. The programmable circuit also includes a partial reconfigurable (PR) module, at the IO periphery of the programmable circuit, to implement a sequencer unit operable to configure the physical interface during a first instance of the PR module, and a controller unit operable to translate commands to the physical interface during a second instance of the PR module.

20 Claims, 8 Drawing Sheets

(56) References Cited

U.S. PATENT DOCUMENTS

| | | | |
|---|---|---|---|
| 7,521,961 B1* | 4/2009 | Anderson | 326/41 |
| 7,535,254 B1 | 5/2009 | Case | |
| 7,565,280 B2 | 7/2009 | Moriat | |
| 7,576,557 B1* | 8/2009 | Tseng | H03K 19/17752 326/14 |
| 7,765,512 B1 | 7/2010 | Neuendorffer et al. | |
| 7,932,743 B1 | 4/2011 | Stewart et al. | |
| 8,069,329 B1 | 11/2011 | Tang et al. | |
| 8,176,450 B1 | 5/2012 | Van Brink | |
| 8,224,638 B1 | 7/2012 | Shirazi et al. | |
| 8,476,926 B1* | 7/2013 | Brunham et al. | 326/39 |
| 8,686,753 B1* | 4/2014 | Herrmann et al. | 326/39 |
| 8,786,310 B1* | 7/2014 | Lu et al. | 326/41 |
| 8,910,109 B1 | 12/2014 | Orthner | |
| 2005/0246520 A1 | 11/2005 | Vadi et al. | |
| 2007/0088537 A1* | 4/2007 | Lertora et al. | 703/28 |
| 2012/0227026 A1* | 9/2012 | Goldman et al. | 716/128 |
| 2013/0007687 A1* | 1/2013 | Mendel et al. | 716/117 |
| 2013/0024657 A1 | 1/2013 | Vorbach | |

OTHER PUBLICATIONS

English translation of abstract for Chinese Patent No. CN 101436225A.
Chinese Search Report dated Aug. 26, 2016.
Robinson, et al.; "Methods of exploiting simulation technology for simulating the timing of dynamically reconfigurable logic"; IEE Proceedings, vol. 147, No. 3, May 2000, pp. 175-180.
European Search Report and Opinion for Application No. 13153239.2, dated Apr. 20, 2017.

* cited by examiner

METHOD AND APPARATUS FOR IMPLEMENTING PERIPHERY DEVICES ON A PROGRAMMABLE CIRCUIT USING PARTIAL RECONFIGURATION

RELATED APPLICATION

This application is a continuation of and claims priority and benefit to U.S. application Ser. No. 13/902,813 filed on May 25, 2013, entitled, "Method and Apparatus for Implementing Periphery Devices on a Programmable Circuit Using Partial Reconfiguration" which is a divisional of and claims priority and benefit to U.S. Pat. No. 8,476,926 filed on Feb. 8, 2012, entitled, "Method and Apparatus for Implementing Periphery Devices on a Programmable Circuit Using Partial Reconfiguration".

FIELD

Embodiments of the present invention relate to periphery devices on target devices and tools for designing periphery devices on target devices. More specifically, embodiments of the present invention relate to a method and apparatus for implementing periphery devices on a programmable circuit using partial reconfiguration (PR).

BACKGROUND

Target devices such as field programmable gate arrays (FPGAs), structured application specific integrated circuits (ASICs), ASICs, and other programmable circuits are used to implement large systems that may include million of gates and megabits of embedded memory. The complexity of a large system often requires the use of electronic design automation (EDA) tools to create and optimize a design for the system onto physical target devices. Among the procedures performed by EDA tools in a computer aided design (CAD) compilation flow are hardware description language (HDL) creation for a system and synthesis, placement, and routing of the system on the target device.

Often times, designers wish to implement a plurality of periphery devices on a target device. Periphery devices reside near the edge of the target device at the input output periphery and utilize input output elements to transmit and receive signals from components external to the target device. Exemplary periphery devices at the input output periphery of a target device may include memory controllers, direct memory access (DMA) controllers, universal asynchronous receiver/transmitters (UARTs), bus controllers, and other devices.

Many periphery devices utilize components that require a large amount of space. This poses a challenge to system designers and EDA tools when having to work with a limited amount of space at the periphery of the target device.

SUMMARY

According to an embodiment of the present invention, components in periphery devices operating at different times are identified and are time multiplexed using partial reconfiguration (PR) to achieve area savings on a target device. PR involves designing a plurality of instances for a PR module on a target device during compilation. Each instance of the PR module represents a different circuit description that can be implemented for the PR module. A selected PR module may be reconfigured from a first instance to a second instance while other PR modules and static modules on the target device remain in active operation.

A programmable circuit is disclosed. The programmable circuit includes a physical interface at an input output (IO) periphery of the programmable circuit. The programmable circuit also includes a PR module at the IO periphery of the programmable circuit. The PR module implements a sequencer unit operable to configure the physical interface during a first instance of the PR module, and a controller unit operable to translate commands to the physical interface during a second instance of the PR module.

BRIEF DESCRIPTION OF THE DRAWINGS

The features and advantages of embodiments of the present invention are illustrated by way of example and are not intended to limit the scope of the embodiments of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
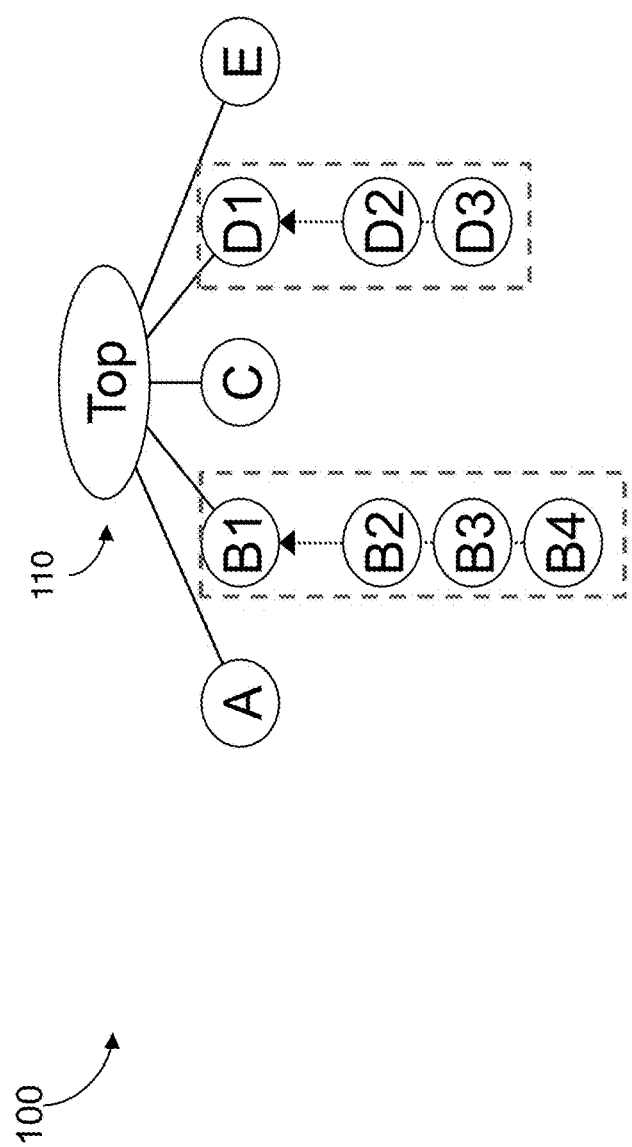
FIG. 1 is a diagram illustrating an exemplary partial reconfiguration (PR) design according to an embodiment of the present invention.

FIG. 1 is a diagram illustrating an exemplary design for a system 100 that uses partial reconfiguration (PR) according to an embodiment of the present invention. The design 100 includes a top-level module 110 that instantiates five lower-level modules, A-E. Each module includes a plurality of components described in register transfer level. Modules A, C, and E, and top-level module 110 are static logic modules. According to an embodiment of the present invention, static logic modules do not change after being programmed on a target device. Modules B and D are PR modules. PR module B has four possible instances, labeled B1-B4. PR module D has three possible instances, labeled D1-D3. According to an embodiment of the present invention, PR modules include a plurality of possible instances where a first instance of a PR module may be changed to a second instance of the PR module after the PR modules are programmed on a target device. Each instance of a PR module represents a different register transfer level (RTL) that can be implemented for the PR module.

According to an embodiment of the present invention, each instance of a PR module includes one or more input ports and one or more output ports. Each input port and output port interfaces with the same static logic on the target device such that the boundaries of the PR module are logically consistent. The input port of each instance of a PR module may be programmed by configurable random access memory (CRAM) bits to receive data from static logic at its boundary. Similarly, the output port of each instance of a PR module may be programmed by CRAM bits to transmit data to static logic at its boundary. It is appreciated that the static logic at the boundary of a PR module may be implemented with a register, a look up table (LUT), a wire, or other component.

Figure 2:
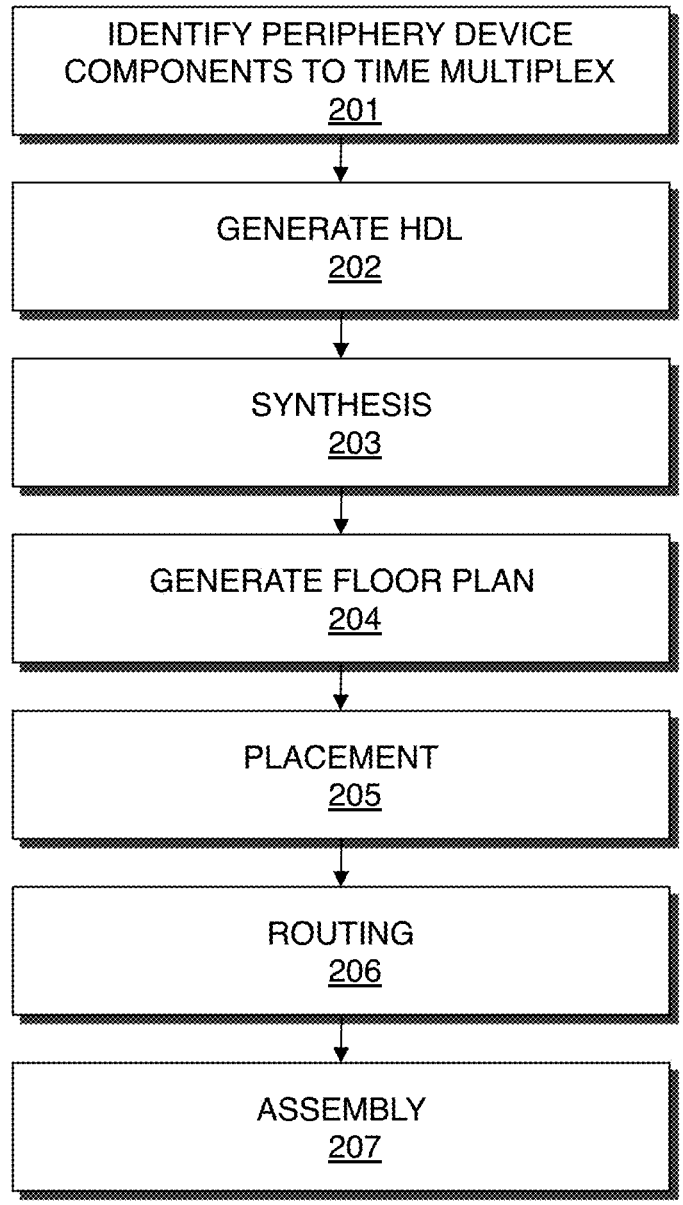
FIG. 2 is a flow chart illustrating a method for designing a system with PR modules on a target device according to an exemplary embodiment of the present invention.

FIG. 2 is a flow chart illustrating a method for designing a system with PR modules on a target device according to an exemplary embodiment of the present invention. The target device may be a field programmable gate array (FPGA), application specific integrated circuit (ASIC), a structured ASIC, or other programmable circuit or device. According to one embodiment, the procedure illustrated in FIG. 2 may be performed by a computer aided design (CAD)/electronic design automation (EDA) tool implemented on a computer system. At 201, components in periphery devices of the system operating at different times are identified. Since the components operate at different times, some of the components may be time multiplexed on the target device using partial reconfiguration to achieve area savings. According to an embodiment of the present invention when the periphery device is an external memory interface, a controller unit and a sequencer unit may be components in the periphery device that are time multiplexed on the target device using partial reconfiguration. It should be appreciated that other components on other types of periphery devices may be analyzed and identified to be time multiplexed.

At 202, a hardware description language (HDL) design definition is generated to describe the system. The HDL is generated in response to specifications of the system provided by a designer. The specifications may be provided by a designer through a design entry tool. The specifications may describe components and interconnections in the system. According to an embodiment of the present invention, identified portions of the specification that are to be implemented as static logic modules, and identified portion of the specification that are time multiplexed in PR modules are described in HDL.

At 203, the system is synthesized. Synthesis includes generating a logic design of the system to be implemented by the target device. According to an embodiment of the present invention, synthesis generates an optimized logical representation of the system which includes the static logic modules and PR modules from the HDL design definition. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 204, a floor plan is generated for the design of the system. According to an embodiment of the present invention, the floor plan designates physical locations ("floor plan regions") on the target device to the synthesized logic generated at 202. According to an embodiment of the present invention, a floor plan region on the target device may be assigned to each of the static modules and PR modules generated from synthesis, e.g., see exemplary floor plan 300 of FIG. 3 described below.

At 205, the system is placed. According to an embodiment of the present invention, placement involves placing the mapped logical system design on the target device at floor planned regions assigned to the modules. Placement works on the technology-mapped netlist to produce a placement for each of the functional blocks. According to an embodiment of the present invention, placement includes fitting the system on the target device by determining which resources on the logic design are to be used for specific logic elements, and other function blocks determined to implement the system as determined during synthesis. Placement may include clustering which involves grouping logic elements together to form the logic clusters present on the target device. According to an embodiment of the present invention, clustering is performed at an early stage of placement and occurs after synthesis during the placement preparation stage.

At 206, the placed design is routed. According to an embodiment of the present invention, the routing resources are allocated to provide interconnections between logic gates, logic elements, and other components in the static logic modules and PR modules. Routability optimization may also be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It is appreciated that one or more of the procedures may be performed on the placed logic design.

At 207, an assembly procedure is performed. The assembly procedure involves creating multiple data files that include information determined by the compilation procedure described. A data file may be a bit stream that may be used to program the entire target device, or a bit stream that may be used to program only specific parts of the target device. According to an embodiment of the present invention, the procedures illustrated in FIG. 2 may be performed by an EDA tool executed on a first computer system. The data files generated may be transmitted to a second computer system to allow the design of the system to be further processed. Alternatively, the data files may be transmitted to a second computer system which may be used to program the target device according to the system design. It is appreciated that the design of the system may also be output in other forms such as on a display device or other medium. The target device may be programmed with a data file that includes information to program or initialize the entire chip, and portions of the chip may be re-programmed using other data files that contain information to program only those portions. By programming the target with a data file, components on the target device are physically transformed to implement the system.

FIG. 2 is a flow chart that illustrates an embodiment of the present invention. Some of the techniques illustrated may be performed sequentially, in parallel or in an order other than that which is described and that the procedures described may be repeated. It is appreciated that not all of the techniques described are required to be performed, that additional techniques may be added, and that some of the illustrated techniques may be substituted with other techniques.

Figure 3:
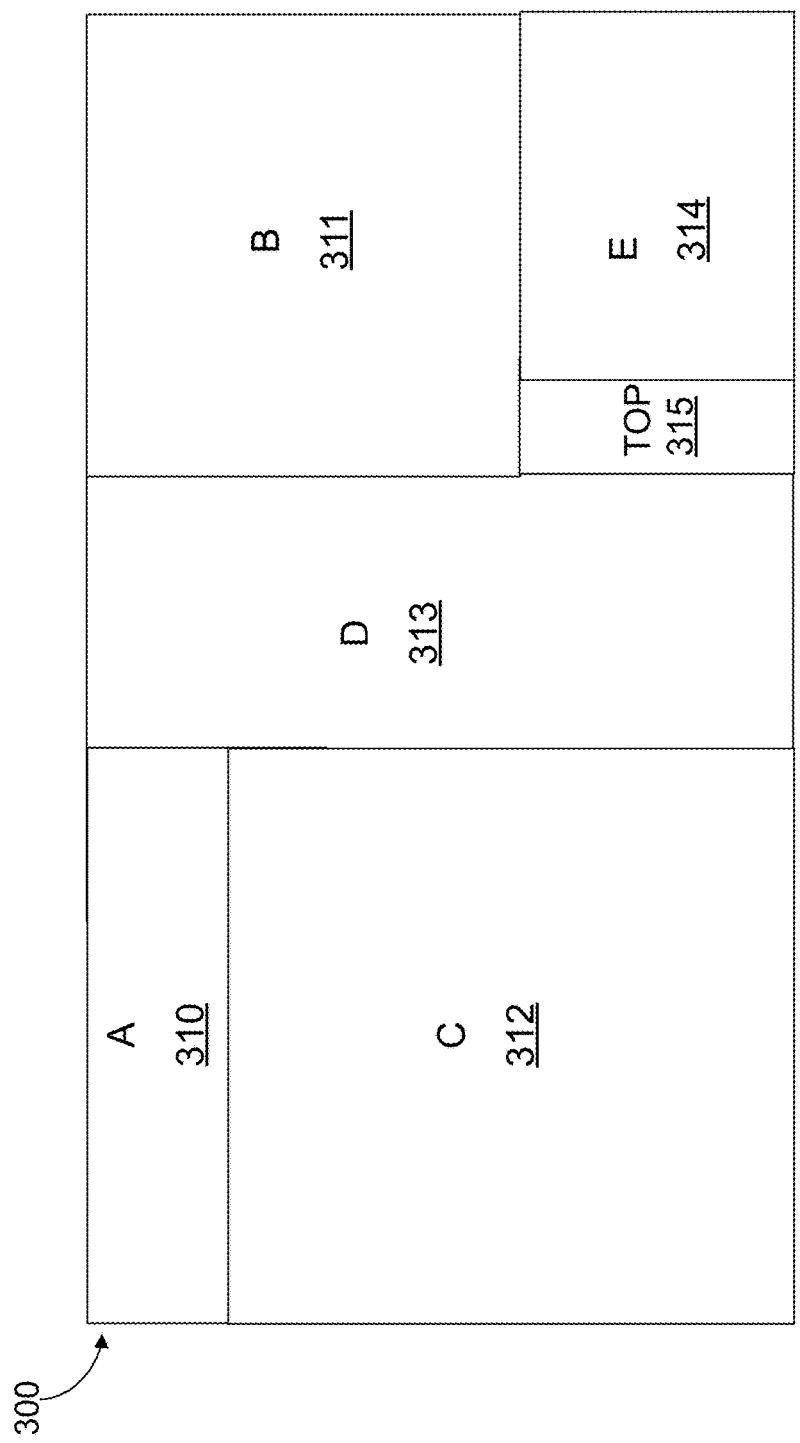
FIG. 3 illustrates an exemplary floor plan of a system on a target device according to an embodiment of the present invention.

FIG. 3 illustrates an exemplary floor plan 300 for the design 100 illustrated in FIG. 1. Floor plan regions 310, 312, 314, and 315 are assigned to static modules A, C, E, and top, respectively. Floor plan region 311 is assigned to PR module B and is thus implicitly assigned to instances B1-B4. Floor plan region 313 is assigned to PR module D and is thus implicitly assigned to instances D1-D3. According to an embodiment of the present invention, the floor plan regions may have any dimension or shape, and need not be contiguous. It is appreciated that the floor plan may be generated by a CAD/EDA tool in response to input provided by a designer regarding the size, shape, and/or location of floor plan regions to assign a module. Alternatively, the floor plan may be generated by a CAD/EDA tool by analysis of the synthesis output netlist alone and independent of any input provided by the designer.

Figure 4:
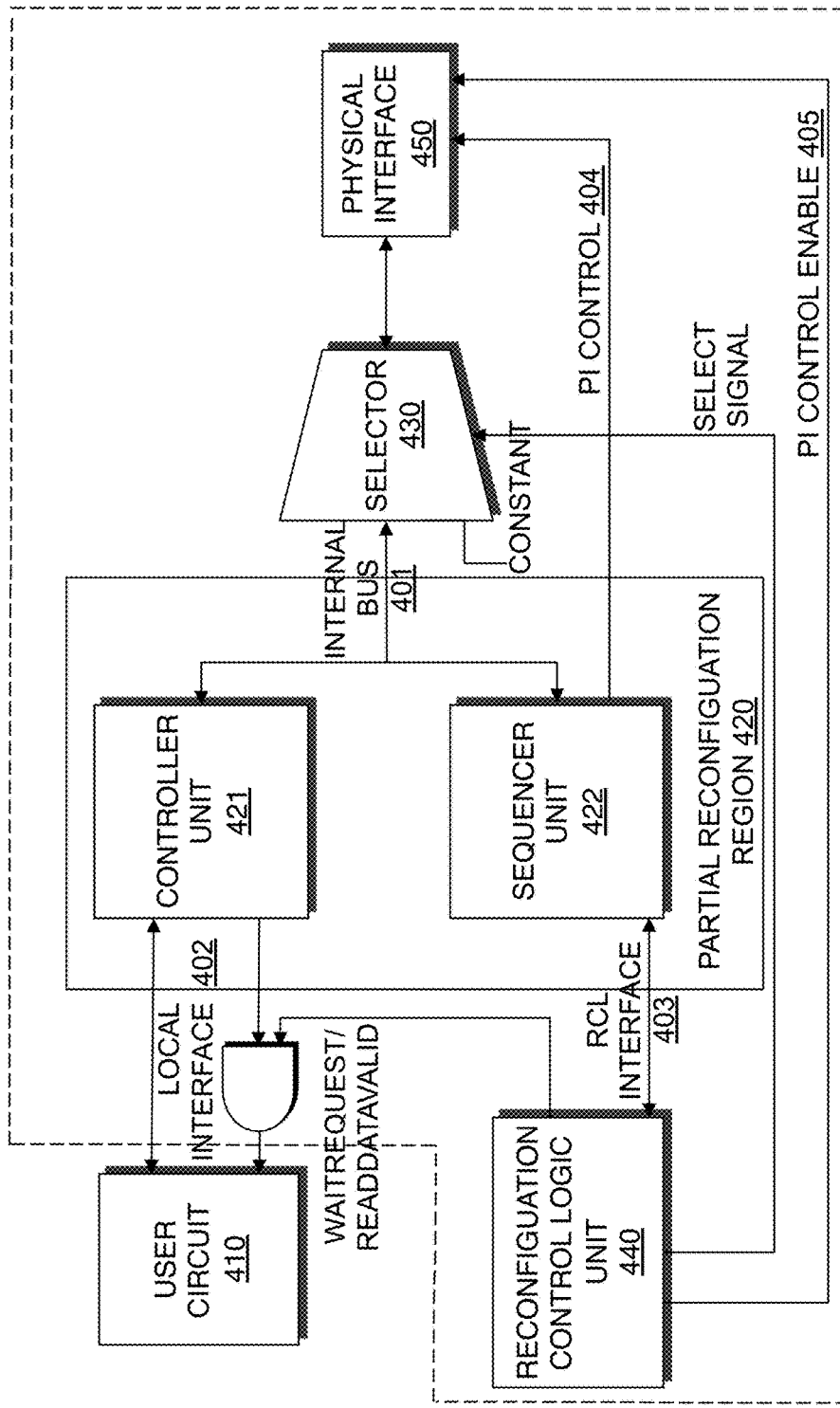
FIG. 4 is a block diagram illustrating a periphery device implemented on a programmable circuit using partial reconfiguration according to a first embodiment of the present invention.

FIG. 4 is a block diagram illustrating a periphery device 400 implemented on a programmable circuit using partial reconfiguration according to a first embodiment of the present invention. The periphery device 400 resides at an input output (IO) periphery of a target device. In this embodiment, the periphery device 400 is an external memory interface. The external memory interface 400 operates in two states. In the first state, the external memory interface 400 is setup and calibrated for use. In the second state, the external memory interface 400 is running and functions to service the operations of a user circuit 410, separate from the external memory interface 400. While some components are required to support both states, other components exist that are used only in either the first state or the second state. By partitioning the components that are used in only one of the two states into a partial reconfiguration region to be implemented by a partial reconfiguration module, logic and area savings may be realized by implementing the components required for a specific state of the external memory interface 400.

The external memory interface 400 includes a partial reconfiguration region 420 used for a partial reconfiguration module. The partial reconfiguration module includes a controller unit 421. The controller unit 421 is operable to translate memory read and write requests, received from the user circuit 410 over a local interface 402 into commands, timing, and signaling levels to communicate with one or more memory devices.

The partial reconfiguration module also includes a sequencer unit 422. The sequencer unit 422 is operable to send and receive test patterns to one or more memory devices, over internal bus 401, and to modify delay elements in a physical interface 450 via physical interface (PI) control 404 to correctly time commands to the one or more memory devices with respect to memory clocks. According to an embodiment of the present invention, the physical interface 450 includes hardened logic of the periphery. Examples of hardened logic in the periphery include input output elements (IOE), buffers, external registers, delay chains, delay lock loops, and other circuitry. The sequencer unit 422 may use the physical interface control 404 to control the delays in the physical interface 450 such as the individual data delays and data strobe delays as well as internal first-in-first-out (FIFO) controls in a FIFO used by the physical interface 450 for leveling and initial capture to the core.

According to an embodiment of the present invention, the partial reconfiguration module may implement either the controller unit 421 or the sequencer unit 422 as the use of these components are mutually exclusive. The ports on the partial reconfiguration module include the internal bus 401 used to communicate with the physical interface 450, the local interface 402 to the user circuit 410, reconfiguration control logic (RCL) interface 403 to a reconfiguration control logic unit 440, and physical interface control 404 to the physical interface 450. Both the controller unit 421 and the sequencer unit 422 use the internal bus 401 when active. The local interface 402 is used only when the controller unit 421 is active and the physical interface control 404 is used only when the sequencer unit 422 is active.

The external memory interface 400 includes a selector 430. According to an embodiment of the present invention, valid data must be received from the internal bus 401, local interface 402, and physical interface control 404. The external memory interface 400 uses the selector 430 to control what the physical interface 450 receives during reconfiguration. The selector 430 is implemented outside the partial reconfiguration region 420 and includes two inputs. A first input of the selector 430 is coupled to the internal bus 401. A second input of the selector 430 is coupled to a source of a constant value. The choice for the constant value may depend on a state desired for the internal bus 401 during reconfiguration. During reconfiguration, the selector 430 is prompted to output the constant value instead of the output from internal bus 401 to the physical interface 450. It should be appreciated that the selector 430 may be implemented as core logic or hardened circuitry. In alternate embodiments of the periphery device 400, the partial reconfiguration region may drive a constant during reconfiguration which would eliminate the use of the selector 430.

The external memory interface 400 includes a reconfiguration control logic unit 440. During reconfiguration of the partial reconfiguration module from a first instance, where the sequencer unit 422 is implemented, to a second instance, where the controller unit 421 is implemented, the reconfiguration control logic 440 prompts the selector 430 to output the constant value via a select signal. After reconfiguration is completed, the reconfiguration control logic 440 prompts the selector 430 to output the values on the internal bus 401. According to an embodiment of the present invention, the reconfiguration control logic unit 440 is informed by the sequencer unit 422 as to when reconfiguration is starting and when reconfiguration is completed via the RCL interface 403. Due to time delays associated with reconfiguration, the sequencer unit 422 may place the external memory into a self refresh mode before signaling to the reconfiguration control logic unit 440 that calibration is complete and the control unit 421 may take the external memory out of self refresh mode after calibration has been completed.

According to an embodiment of the present invention, the sequencer unit 422 is used only during calibration. After calibration, the physical interface control 404 from the sequencer unit 422 is set to inactive. The reconfiguration control logic unit 440 disables the physical interface control 404 during reconfiguration and when the controller unit 421 is active by deasserting the physical interface (PI) control enable signal 405. By disabling the physical interface control 404, stray or random signals will not appear on the physical interface 450.

The controller unit 421 is used only after calibration and after reconfiguration. Prior to calibration and reconfiguration, the local interface 402 must not transmit data from the user circuit 410 to the controller unit 421. According to an embodiment of the present invention, a ready signal transmitted from the reconfiguration control logic unit 440 which signals that calibration and reconfiguration is complete is ANDed with a waitrequest/readdatavalid signal from the controller unit 421 to indicate to the user circuit 410 that data from the local interface 402 is valid. It should be appreciated that other configurations of this mechanism may be used. For example, the ready signal from the reconfiguration control logic unit 440 may be transmitted directly to the user circuit 410.

The reconfiguration control logic unit 440 has been described to operate in conjunction and in response to the sequencer unit 422 as described. It should be appreciated that the reconfiguration control logic unit 440 may also operate in response to a user. This allows the user to initiate recalibration and setup.

Figure 5:
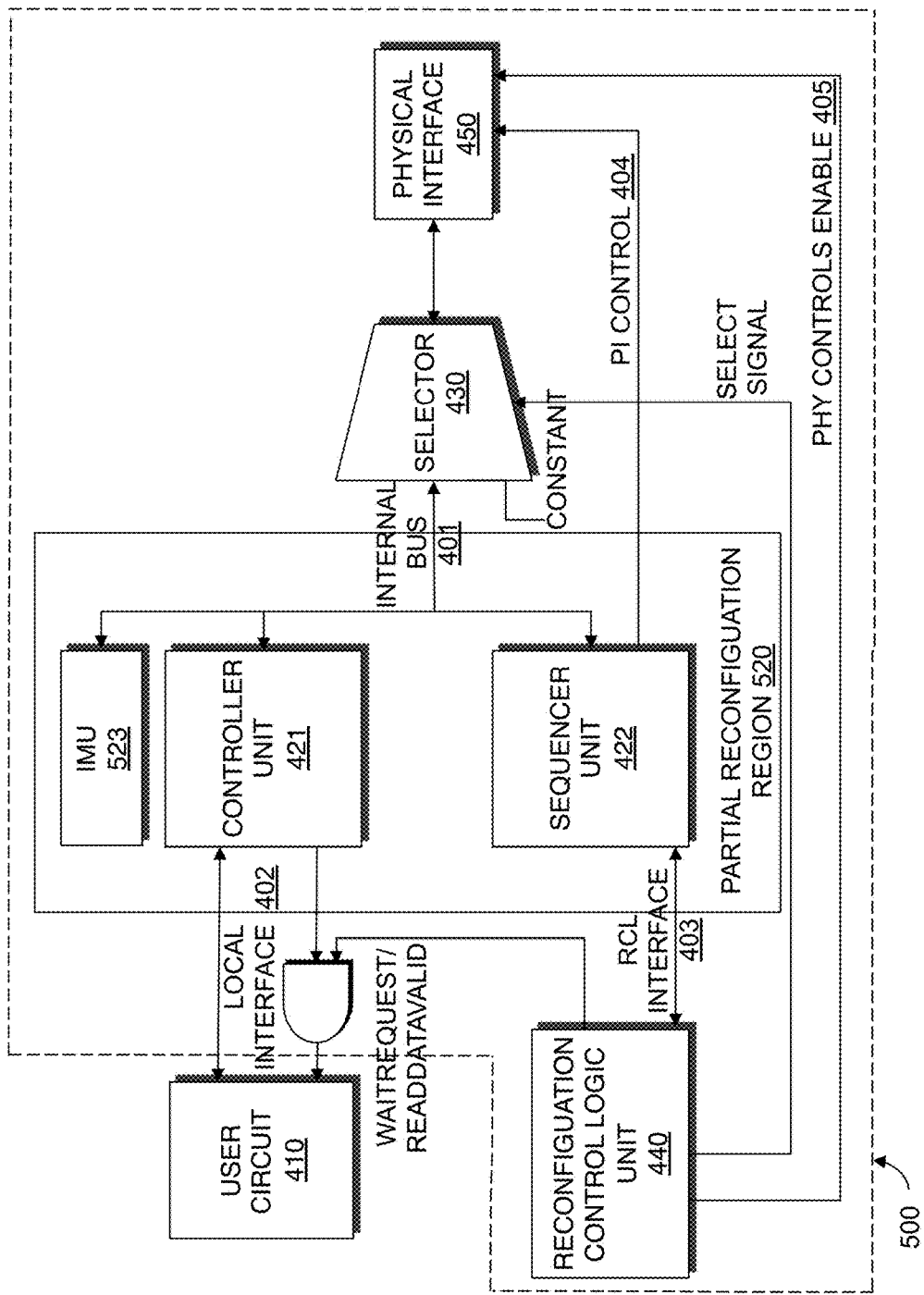
FIG. 5 is a block diagram illustrating a periphery device implemented on a programmable circuit using partial reconfiguration according to a second embodiment of the present invention.

FIG. 5 is a block diagram illustrating a periphery device 500 implemented on a programmable circuit using partial reconfiguration according to a second embodiment of the present invention. In this embodiment, the periphery device 500 is also an external memory interface. The external memory interface 500 operates in three states. In the first state, the external memory interface 500 is setup and calibrated for use. In the second state, the external memory interface 500 is running and functions to service the operations of a user circuit 410, separate from the external memory interface 500. In the third state, interface with an external memory is not desired and components in the external memory interface 500 are swapped out. While some components in the external memory interface 500 are required to support all three states, other components exist that are used only in either the first, second, or third state. By partitioning the components that are used in only one of the three states into a partial reconfiguration region to be implemented by a partial reconfiguration module, logic savings may be realized by implementing the components required for a specific state of the external memory interface 500.

The external memory interface 500 includes components similar to those described with reference to external memory interface 400 shown in FIG. 4. The external memory interface 500 also includes an interface maintenance unit (IMU) 523 operable to transmit a command to the external memory to keep the external memory in an active state during the third instance of the PR module. The interface maintenance unit 523 may also include other components or perform other functions that may be useful to a system other than interfacing an external memory. Prior to reconfiguring the partial reconfiguration module to implement the third state, the controller unit 421 or sequencer unit 422 may put the external memory in a self refresh mode by issuing an appropriate command. The memory signals may be driven to a constant value leaving all area required by the controller unit 421 and the sequencer unit 422 to be available for reconfiguration. While the external memory is in self refresh mode, the original contents of the external memory may be preserved so that when a configuration requiring access to the external memory is programmed, all previous data is still available.

FIGS. 4 and 5 describe embodiments of the present invention where the periphery devices 400 and 500 are external memory interfaces. It should be appreciated, however, that aspects of the periphery devices 400 and 500 may also be used to implement other types of devices and interfaces. For example, the periphery devices 400 and 500 may be used to implement bus controllers, DMA controllers, UARTs, and other periphery devices which utilize components that may be time multiplexed by using partial reconfiguration to achieve area savings on a programmable circuit. In these other embodiments, the controller unit 421, sequencer unit 422, and reconfiguration control logic unit 440 may perform other or additional functionalities to support these embodiments.

Figure 6:
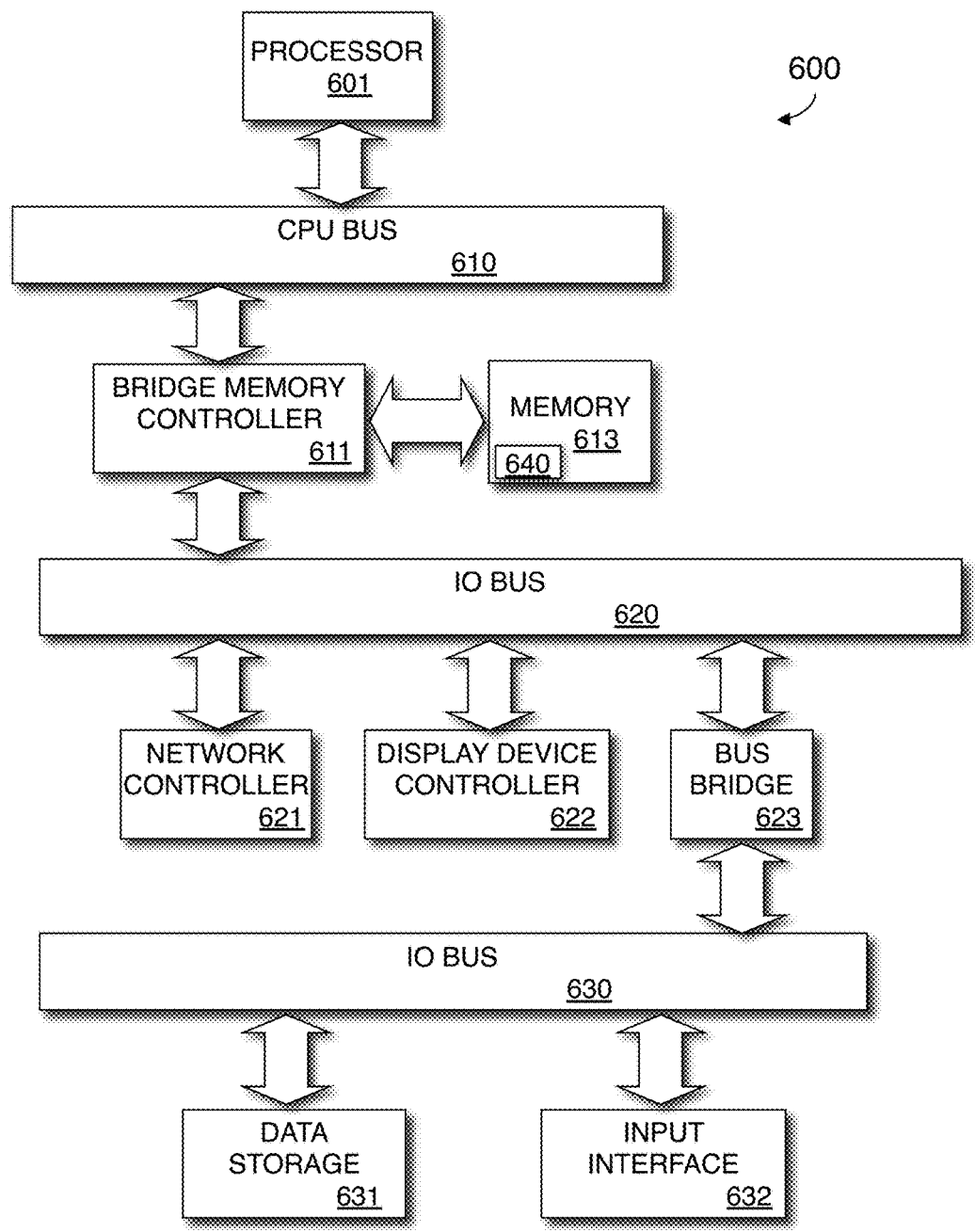
FIG. 6 illustrates a block diagram of a computer system implementing a system designer according to an embodiment of the present invention.

FIG. 6 is a block diagram of an exemplary computer system 600 in which an example embodiment of the present invention resides. The computer system 600 includes a processor 610 that processes data signals. The processor 601 is coupled to a CPU bus 610 or other switch fabric that transmits data signals between processor 601 and other components in the computer system 600.

The computer system 600 includes a memory 613. The memory 613 may store instructions and code represented by data signals that may be executed by the processor 601. A bridge memory controller 611 is coupled to the CPU bus 610 and the memory 613. The bridge memory controller 611 directs data signals between processor 601, the memory 613, and other components in the computer system 600 and bridges the data signals between the CPU bus 610, the memory 613, and a first IO bus 620. According to an embodiment of the present invention, the processor 601 may be directly coupled to the memory 613 and communicates with the memory 613 without a bridge memory controller 611.

The first IO bus 620 may be a single bus or a combination of multiple buses. The first IO bus 620 provides communication links between components in the computer system 600. A network controller 621 is coupled to the first IO bus 620. The network controller 621 may link the computer system 600 to a network of computers (not shown) and supports communication among the machines. A display device controller 622 is coupled to the first IO bus 620. The display device controller 622 allows coupling of a display device (not shown) to the computer system 600 and acts as an interface between the display device and the computer system 600.

A second IO bus 630 may be a single bus or a combination of multiple buses. The second IO bus 630 provides communication links between components in the computer system 600. A data storage device 631 is coupled to the second IO bus 630. An input interface 632 is coupled to the second IO bus 630. The input interface 632 allows coupling of an input device to the computer system 600 and transmits data signals from an input device to the computer system 600. A bus bridge 623 couples the first IO bus 620 to the second IO bus 630. The bus bridge 623 operates to buffer and bridge data signals between the first IO bus 620 and the second IO bus 630. It should be appreciated that computer systems having a different architecture may also be used to implement the computer system 600.

A system designer 640 may reside in memory 613 and be executed by the processor 601. The system designer 640 may operate to identify periphery device components to time multiplex, generate HDL, synthesize a system, generate a floor plan, place the system on a target device, route the system on the target device, assemble the system, and/or perform other procedures such as those described in FIG. 2.

Figure 7:
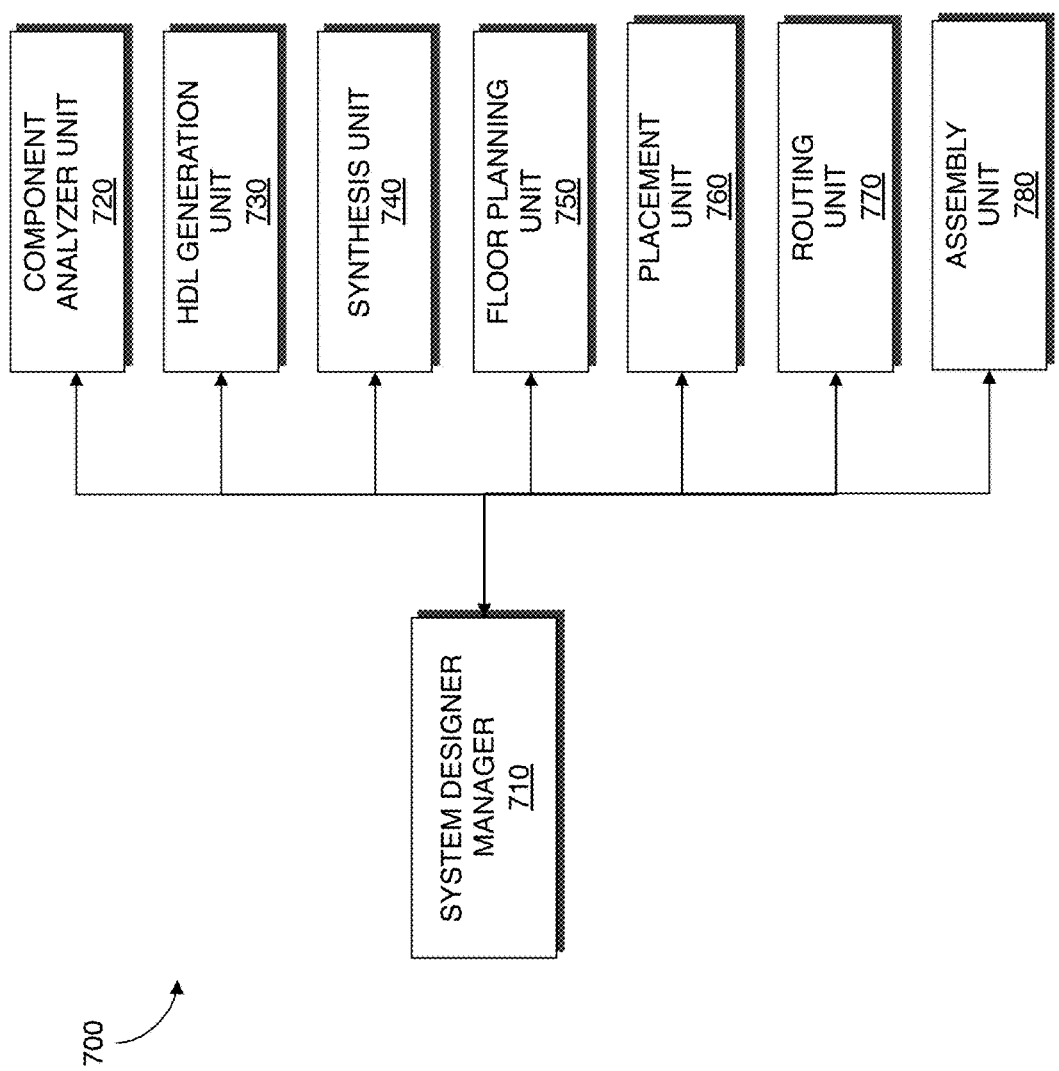
FIG. 7 illustrates a block diagram of a system designer according to an embodiment of the present invention.

FIG. 7 illustrates a system designer 700 according to an embodiment of the present invention. The system designer 700 may be an EDA tool for designing a system on a target device such as an FPGA, structured application structured integrated circuit (ASIC), ASIC, or other programmable circuit. FIG. 7 illustrates modules implementing an embodiment of the system designer 700. According to one embodiment, the modules represent software modules and system design may be performed by a computer system such as the one illustrated in FIG. 6 executing sequences of instructions represented by the modules shown in FIG. 7. Execution of the sequences of instructions causes the computer system to support system design as will be described hereafter. In alternate embodiments, hard-wire circuitry may be used in place of or in combination with software instructions to implement embodiments of present invention. Thus, embodiments of present invention are not limited to any specific combination of hardware circuitry and software. The system designer 700 includes a designer manager 710. The designer manager 710 is connected to and transmits data between the components of the system designer 700.

The system designer 700 includes a component analyzer unit 720. The component analyzer unit 720 identifies components in periphery devices of the system that operate at different times. Since the components operate at different times, some of the components may be time multiplexed on the target device using partial reconfiguration to achieve area savings. According to an embodiment of the present invention when the periphery device is an external memory interface, a controller unit and a sequencer unit may be components in the periphery device that are time multiplexed on the target device using partial reconfiguration.

The system designer 700 includes an HDL generation unit 730. The HDL generation unit generates HDL that describes the system in response to specifications of the system provided by a designer. The specifications may be provided by a designer through a design entry tool. The specifications may describe components and interconnections in the system. According to an embodiment of the present invention, identification of portions of the specification that are to be implemented as static logic modules and portions of the specification that may be time multiplexed in PR modules are described in HDL.

The system designer 700 includes a synthesis unit 740 that performs synthesis. The synthesis unit 740 generates a logic design of a system to be implemented on the target device. According to an embodiment of the system designer 700, the synthesis unit 740 takes a conceptual HDL design definition and generates an optimized logical representation of the system which includes the static logic modules and PR modules from the HDL design definition. The optimized logical representation of the system generated by the synthesis unit 740 may include a representation that has a minimized number of functional blocks and registers, such as logic gates and logic elements, required for the system. Alternatively, the optimized logical representation of the system generated by the synthesis unit 740 may include a representation that has a reduced depth of logic and that generates a lower signal propagation delay.

The synthesis unit 740 also performs technology mapping. Technology mapping involves determining how to implement the functional blocks and registers in the optimized logic representation utilizing specific resources such as cells on a target device thus creating an optimized "technology-mapped" netlist. The technology-mapped netlist illustrates how the resources (cells) on the target device are utilized to implement the system. In an embodiment where the target device is an FPGA, the technology-mapped netlist may include cells such as logic array blocks (LABs), registers, memory blocks, digital signal processing (DSP) blocks, input output (IO) elements or other components.

The system designer 700 includes a floor planning unit 750. The floor planning unit 750 generates a floor plan for the design of the system. According to an embodiment of the present invention, the floor plan designates physical locations ("floor plan regions") on the target device to the synthesized logic generated by the synthesis unit 740. According to an embodiment of the present invention, a floor plan region on the target device may be assigned to each of the static modules and PR modules generated from synthesis.

The system designer 700 includes a placement unit 760 that processes the optimized technology-mapped netlist to produce a placement for each of the functional blocks. The placement identifies which components or areas on the target device are to be used for specific functional blocks and registers.

The system designer 700 includes a routing unit 770 that performs routing. The routing unit 770 determines the routing resources on the target device to use to provide interconnection between the components implementing functional blocks and registers of the logic design.

The system designer 700 includes an assembly unit 780 that performs an assembly procedure that creates a data file that includes the design of the system generated by the system designer 700. The data file may be a bit stream that may be used to program the target device. The assembly unit 780 may output the data file so that the data file may be stored or alternatively transmitted to a separate machine used to program the target device. It should be appreciated that the assembly unit 780 may also output the design of the system in other forms such as on a display device or other medium.

It should be appreciated that embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 8:
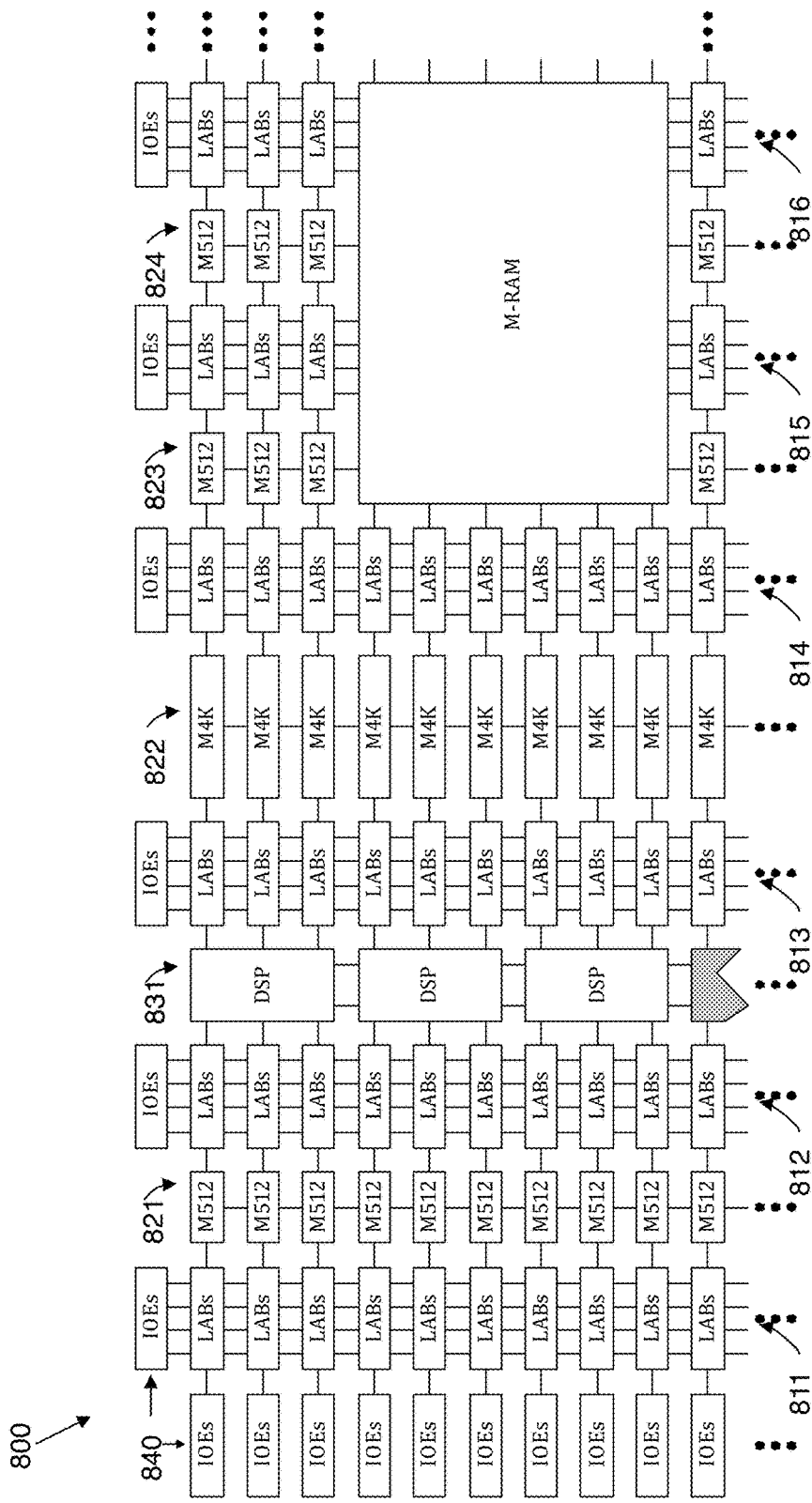
FIG. 8 illustrates an exemplary target device according to an embodiment of the present invention.

FIG. 8 illustrates a device 800 that may be used to implement a target device according to an embodiment of the present invention. The device 800 is a field programmable gate array (FPGA) that includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input LUT with a configurable register. According to an alternate embodiment of the present invention, the logic block may operate similarly to an adaptive logic module (ALM), such as those found in Stratix devices manufactured by Altera Corporation. LABs are grouped into rows and columns across the device 800. Columns of LABs are shown as 811-816. It should be appreciated that the logic block may include additional or alternate components.

The device 800 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 800. Columns of memory blocks are shown as 821-824.

The device 800 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 800 and are shown as 831.

The device 800 includes a plurality of input/output elements (IOEs) 840. The IOEs 804 reside at a periphery of the device 800. Each IOE feeds an IO pin (not shown) on the device 800. The IOEs 840 are located at the end of LAB rows and columns around the periphery of the device 800. Each IOE may include a bidirectional IO buffer and a plurality of registers for registering input, output, and output-enable signals.

The device 800 may include routing resources such as LAB local interconnect lines, row interconnect lines ("H-type wires"), and column interconnect lines ("V-type wires") (not shown) to route signals between components on the target device.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, the method comprising:
   identifying a first component in the system and a second component in the system that operate at a different time;
   partitioning the first component and second component such that the first component is implemented by a first instance of a partial reconfigurable (PR) module on the target device and the second component is implemented by a second instance of the PR module; and
   generating a reconfiguration control logic unit for the system that initiates the first instance and the second instance of the PR module in response to user input, wherein at least one of the identifying, partitioning, and generating is performed by a processor.

2. The method of claim 1, wherein each of the first and second instances of the PR module comprises a unique circuit description of the PR module and each of the different circuit description interfaces with a same static logic.

3. The method of claim 1 further comprising:
   synthesizing the system;
   generating a floor plan for the system;
   placing the system according to the floor plan on the target device; and
   routing the system on the target device.

4. The method of claim 1, wherein first component comprises a sequencer unit that configures a physical interface during the first instance of the PR module, and the second component comprises a controller unit that translates commands to the physical interface during the second instance of the PR module.

5. The method of claim 1, wherein the PR module utilizes one or more resources on the target device to implement the sequencer unit in the first instance and to implement the controller unit in the second instance.

6. The method of claim 1, wherein the second component occupies a location on the target device in the second instance of the PR module formerly occupied by the first component during the first instance of the PR module.

7. A non-transitory computer readable medium including a sequence of instructions stored thereon for causing a computer to execute a method comprising:
   identifying a first component and a second component that operate at a different time on a system;
   partitioning the first component and second component such that the first component is implemented by a first instance of a partial reconfigurable (PR) module and the second component is implemented by a second instance of the PR module; and
   generating a reconfiguration control logic unit for the system that initiates the first instance and the second instance of the PR module in response to user input.

8. The non-transitory computer readable medium of claim 7, wherein each of the first and second instances of the PR module comprises a unique circuit description of the PR module and each of the different circuit description interfaces with a same static logic.

9. The non-transitory computer readable medium of claim 8, wherein the method further comprises:
   synthesizing the system;
   generating a floor plan for the system;
   placing the system according to the floor plan on a target device; and
   routing the system on the target device.

10. The non-transitory computer readable medium of claim 7, wherein first component comprises a sequencer unit that configures a physical interface during the first instance of the PR module, and the second component comprises a controller unit that translates commands to the physical interface during the second instance of the PR module.

11. The non-transitory computer readable medium of claim 7, wherein the PR module utilizes one or more resources on the target device to implement the sequencer unit in the first instance and to implement the controller unit in the second instance.

12. The non-transitory computer readable medium of claim 7, wherein the second component occupies a location on the target device in the second instance of the PR module formerly occupied by the first component during the first instance of the PR module.

13. A system designer, comprising:
   a component analyzer unit that identifies a first component and a second component that operate at a different time, that partitions the first component and the second component such that the first component is implemented by a first instance of a partial reconfigurable (PR) module and the second component is implemented by a second instance of the PR module, and that generates a reconfiguration control logic unit that initiates the first instance and the second instance of the PR module in response to user input, wherein the component analyzer unit is implemented by a processor.

14. The system designer of claim 13 further comprising:
a synthesis unit that synthesizes the PR module with static modules;
a floor planning unit that generates a floor plan for the system on a target device;
a placement unit that places the system according to the floor plan on the target device; and
a routing unit that routes the system on the target device.

15. The system designer of claim 13, wherein each of the first and second instances of the PR module comprises a unique circuit description of the PR module and each of the different circuit description interfaces with a same static logic.

16. A programmable circuit, comprising:
a physical interface;
a partial reconfigurable (PR) module that implements a first component during a first instance of the PR module, and a second component during a second instance of the PR module; and
a reconfiguration control logic unit that initiates the first instance and the second instance of the PR module in response to user input.

17. The programmable circuit of claim 16, wherein the PR module utilizes one or more resources on the programmable circuit used to implement the first component in the first instance and to implement the second component in the second instance.

18. The programmable circuit of claim 16, wherein the second component occupies a location on the programmable circuit in the second instance of the PR module formerly occupied by the first component during the first instance of the PR module.

19. The programmable circuit of claim 1 further comprising a selector that couples the PR module to the physical interface, wherein said selector transmits valid data to the physical interface during reconfiguration of the PR module.

20. The programmable circuit of claim 1, wherein the first component is a sequencer unit, and the second component is a controller unit.

* * * * *